(12) United States Patent
Wakita et al.

(10) Patent No.: US 6,728,937 B2
(45) Date of Patent: Apr. 27, 2004

(54) CIRCUIT SIMULATION DEVICE FOR PREDICTING THE DISPERSION OF CIRCUIT CHARACTERISTICS AND THE ELECTRIC CHARACTERISTICS

(75) Inventors: Naoki Wakita, Kanagawa-ken (JP); Tetsuya Yamaguchi, Kanagawa-ken (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 432 days.

(21) Appl. No.: 09/750,727

(22) Filed: Dec. 28, 2000

(65) Prior Publication Data

US 2001/0007143 A1 Jul. 5, 2001

(30) Foreign Application Priority Data

Dec. 28, 1999 (JP) .......................................... P11-375842

(51) Int. Cl.[7] .............................................. G06F 17/50
(52) U.S. Cl. ...................... 716/4; 716/5; 716/1; 716/14
(58) Field of Search ......................... 716/4, 5, 1; 703/14

(56) References Cited

U.S. PATENT DOCUMENTS 6,219,630 B1 * 4/2001 Yonezawa et al. ............ 703/14

OTHER PUBLICATIONS pdFab Modeling Reference Manual, V2.1, Chapter 8, *Definition of Mos Physicals and Spice Parameters*, PDF Solutions, 1994.

* cited by examiner

Primary Examiner—Vuthe Siek
Assistant Examiner—Brandon Bowers
(74) Attorney, Agent, or Firm—Brenda O. Holmes; Kilpatrick Stockton LLP (57) ABSTRACT

In the disclosed invention, the influence of the dispersions of the gate lengths and the gate widths is prevented from adversely affecting circuit parameters except for the specific circuit parameter. According to this invention, the circuit parameters can be correctly extracted, and circuit characteristics can be accurately predicted.

8 Claims, 6 Drawing Sheets

FIG. 4B $$\text{LINT'} = \text{LINTactual} - \delta L \qquad \delta L = \frac{\text{Lactual} - \text{Lo}}{2}$$

$$\text{WINT'} = \text{WINTactual} - \delta W \qquad \delta W = \frac{\text{Wactual} - \text{Wo}}{2}$$

CIRCUIT SIMULATION DEVICE FOR PREDICTING THE DISPERSION OF CIRCUIT CHARACTERISTICS AND THE ELECTRIC CHARACTERISTICS

CROSS REFERENCE TO RELATED APPLICATIONS

The subject application is related to subject matter disclosed in the Japanese Patent Application No.Hei11-375842 filed in Dec. 28, 1999 in Japan, to which the subject application claims priority under the Paris Convention and which is incorporated by reference herein.

BACKGROUND OF THE INVENTION

1. Field of the Invention

The present invention relates to a circuit simulation device for, by using pieces of information related to the element structures and electric characteristics of a plurality of semiconductor elements, predicting the dispersion of circuit characteristics caused by differences of the element structures and the electric characteristics from design values, a circuit simulation method, a circuit simulation program product, and a circuit manufacturing method for, by using pieces of information related to the element structures and electric characteristics of a plurality of semiconductor elements, predicting the dispersion of circuit characteristics caused by differences of the element structures and the electric characteristics from design values, for determining conditions for manufacturing a circuit with reference to the dispersion, and for manufacturing the circuit on the basis of the circuit manufacturing conditions and, more particularly, to a technique for considerably increasing the yield of a circuit manufacturing process.

2. Description of the Related Art

In recent years, with a rapid advance of micropatterning of semiconductor elements, an influence on circuit characteristics caused by differences (=variation in process) of the structures and electric characteristics of semiconductor elements from design values occurring in the process of manufacturing semiconductor elements becomes very conspicuous. For such a background, recently, the following process has been actively performed. That is, the dispersion of circuit characteristics caused by variation in process is predicted by simulation using a computer system, and, with reference to the results, devices and circuits are manufactured.

As a means, which has been proposed up to now, for predicting the dispersion of circuit characteristics caused by variation in process, a means for extracting sets of circuit parameters from the structures and electric characteristics of a plurality of elements which are influenced by the variation in process and for giving the extracted circuit parameter sets to a circuit simulator to obtain a distribution state of the circuit characteristics is generally used.

In the following description, by using a MOSFET (Metal Oxide Semiconductor Field Effect Transistor) as an example, two concrete examples of conventional dispersion predicting methods for circuit characteristics will be introduced.

In the first dispersion predicting method, a plurality of MOSFETs influenced by variation in process in manufacturing are actually measured, or the dispersion of process conditions is given to a process/device simulator, so that pieces of information related to the element structures and electric characteristics of the MOSFETs. Thereafter, by using the pieces of information related to the element structures and the electric characteristics of the MOSFETs are collected, circuit parameters related to the MOSFETs are extracted in a state that gate lengths L (gate widths W) in analytic model equations of the MOSFETs are fixed to a gate length L0 (gate width W0) which is a design value. Subsequently, a plurality of obtained circuit parameters are given to the circuit simulator, and circuit simulation in a state that the gate lengths (gate widths W) in the analytic model equations of the MOSFETs are fixed to the gate length L0 (gate width W0) which is the design value is performed, so that the dispersion of circuit characteristics of the MOSFETs is evaluated.

In this case, as information given to the circuit simulation, in addition to the circuit parameters, a response surface model (model generated on the basis of Response Surface Methodology) representing circuit parameters by using a pricipal component obtained by performing principal component analysis to circuit parameter sets of the plurality of MOSFETs or a corner model may be given. However, the details of these models are omitted.

The "extraction of circuit parameters" mentioned here means general processes for determining the values of parameters (to be referred to as circuit parameters hereinafter) in such analytic model equations that electric characteristics obtained by collecting the analytic model equations of the MOSFET incorporated in the circuit simulation.

In addition, the "analytic model of the MOSFET" means general equations in which the inter-terminal currents, conductances, capacitances, and terminal charges of the MOSFETs are expressed by the functions of circuit variables such as a terminal bias, gate lengths L, gate widths W, and temperatures T and circuit parameters determined depending on a semiconductor element manufacturing process.

On the other hand, in the second dispersion predicting method, unlike in the first method, when circuit parameters are extracted, gate lengths L (gate widths W) in the analytic model equations of MOSFETs are set to be actual gate lengths Lactual (gate widths Wactual) of the MOSFETs.

Here, when information related to element structures obtained by process/device simulation exists, information related to the actual (=in consideration of variation in process) gate lengths Lactual (gate widths Wactual) can be extracted from the information related to the element structures (more specifically, see PDFAB v2.1 Modeling Reference Manual, PDF Solutions, Inc.). When structure information of real devices exist, the information related to the actual gate lengths Lactual can be extracted by a method in which the sizes of SEM (scanning electron microscope) pictures are measured or other methods.

In this manner, in the conventional circuit manufacturing process, in general, a plurality of circuit parameter sets are extracted from the structures and the electric characteristics of a plurality of elements, and a device manufacturing or circuit manufacturing are performed with reference to a distribution state of circuit characteristics obtained by giving the extracted circuit parameter sets to the circuit simulator. However, the conventional circuit manufacturing process has the following technical problem to be solved.

First, in the conventional circuit manufacturing process, as in the first dispersion predicting method, although the gate lengths and the gate widths of the MOSFETs vary, the gate lengths L (gate widths W) in the analytic model equations are set to be the design values L0 (W0) in extraction of circuit parameters. For this reason, the differences (Lerr= Lactual–L0, Werr=Wactual–W0) between the gate lengths (gate widths W) adversely affect the other circuit parameters. In addition, since the adverse affection changes depending on an extraction strategy of the circuit parameters, parameters which the adverse affection are given cannot be predicted at all. More specifically, in the conventional circuit manufacturing process, since the circuit parameters which are adversely affected by the influence of the errors of the gate lengths and the gate widths cannot be physically and correctly extracted, the circuit characteristics when the gate lengths and the gate widths change cannot be correctly predicted. As a result, the yield of the circuit manufacturing process cannot be improved.

A simple example will be introduced to understand the above problem.

It is assumed that the drain current analytic model equation is given by:

$$Ids=(W/L)\cdot U0\cdot A\cdot Vds, \quad \text{(Equation 1)}$$

and that a drain current Ids is Ids1 when a drain voltage Vds is Vds1.

In this case, when an actual gate length Lactual is given, (equation 1) is given by:

$$Ids1=(W/Lactual)\cdot U01\cdot A\cdot Vds1. \quad \text{(equation 2)}$$

For this reason, by using the value of a parameter value U0, a value U01 which reflects variation in process can be extracted.

However, when the value of U0 is extracted under the condition that L=L0 (L0≠Lactual) is satisfied, $$Ids1=(W/L0)\cdot U01'\cdot A\cdot Vds1=(W/L0)\cdot U01 \\ (L0/Lactual)\cdot A\cdot Vds1 \quad \text{(equation 3)}$$

is satisfied. The influence of Lerr adversely affects the circuit parameter U0, $$U01'=U01\ (Lactual-Lerr)/Lactual\neq U01$$

is satisfied. A physically correct value cannot be obtained.

Second, in the conventional circuit manufacturing process, unlike in the second dispersion predicting method, information related to variation in the gate length L (gate width W) is not transmitted to the circuit simulation. More specifically, in general, in an analytic model such as BSIM3 (Berkeley Short-channel IGFFT Model) which does not depend on the gate length and the gate width, the electric characteristics of a MOSFET having an arbitrary gate length and an arbitrary gate width are reproduced by one circuit parameter set. The values of the gate length and the gate width do not exist as model parameters, but are newly given in calculation of the electric characteristics by circuit simulation. More specifically, if the model parameters of a model parameter set are extracted as physically correct values, the model parameter set do not include information related to variation in the gate length and the gate width. As a result, the information, which is included in the original data, related to the variation in the gate length and the gate width are lost, the dispersion of the circuit characteristics is underestimated by the lost information. As a result, the yield of the circuit manufacturing process cannot be improved.

SUMMARY OF THE INVENTION

The present invention has been made in consideration of the above technical problems, and has as its object to provide a circuit simulation device for considerably improving the yield of a circuit manufacturing process.

It is another object of the present invention to provide a circuit simulation method for considerably improving the yield of a circuit manufacturing process.

In addition, it is still another object of the present invention to provide a computer readable recording medium in which a circuit simulation program for considerably improving the yield of a circuit manufacturing process is stored.

Furthermore, it is still another object of the present invention to provide a circuit manufacturing method for considerably improving the yield of a circuit manufacturing process.

For the technical problems described above, the present inventors correctly reflect the magnitude of the dispersions of gate lengths and gate widths on a specific circuit parameter to extract another circuit parameter, so that the influence of the dispersions of the gate lengths and the gate widths is prevented from adversely affecting circuit parameters except for the specific circuit parameter. For this reason, the circuit parameters can be correctly extracted, and circuit characteristics can be accurately predicted. As a result, the present inventors thought that manufacturing conditions for a circuit having desired circuit characteristics could be correctly determined to make it possible to perform a semiconductor manufacturing process at a high yield.

According to the present invention, since the magnitudes of the dispersions of gate lengths and gate widths are included in a specific circuit parameter, even though a distribution is not given to a description portion of the gate lengths and the gate width in execution of circuit simulation, the influence of the dispersions of the gate lengths and the gate widths can be reflected on a simulation result. Circuit characteristics can be evaluated at a high accuracy in consideration of the influence of variation in process.

According to the present invention, since actual gate lengths and actual gate widths are used in extraction of circuit parameters, the circuit parameters can be extracted at a high accuracy.

Furthermore, according to the present invention, when circuit characteristics are to be analyzed, dispersion can be given to gate lengths and gate widths. For this reason, the dispersion of circuit characteristics can be correctly evaluated, and the magnitude of the dispersion can be correctly predicted.

Other and further objects and features of the present invention will become obvious upon understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE PREFERRED EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

The configurations and operations of circuit manufacturing systems, circuit manufacturing methods, and computer readable recording media in which circuit manufacturing programs are stored according to the first and second embodiments of the present invention will be described below with reference to FIGS. 1 to 6. In the following description, although explanation will be performed by using a MOSFET as a semiconductor element, the present invention is not limited to this configuration. For example, an SOI device or the like may be used, and any configuration having gate electrodes can be employed.

First Embodiment

First, the configuration of a circuit manufacturing system according to the first embodiment of the present invention will be described below.

Figure 1:
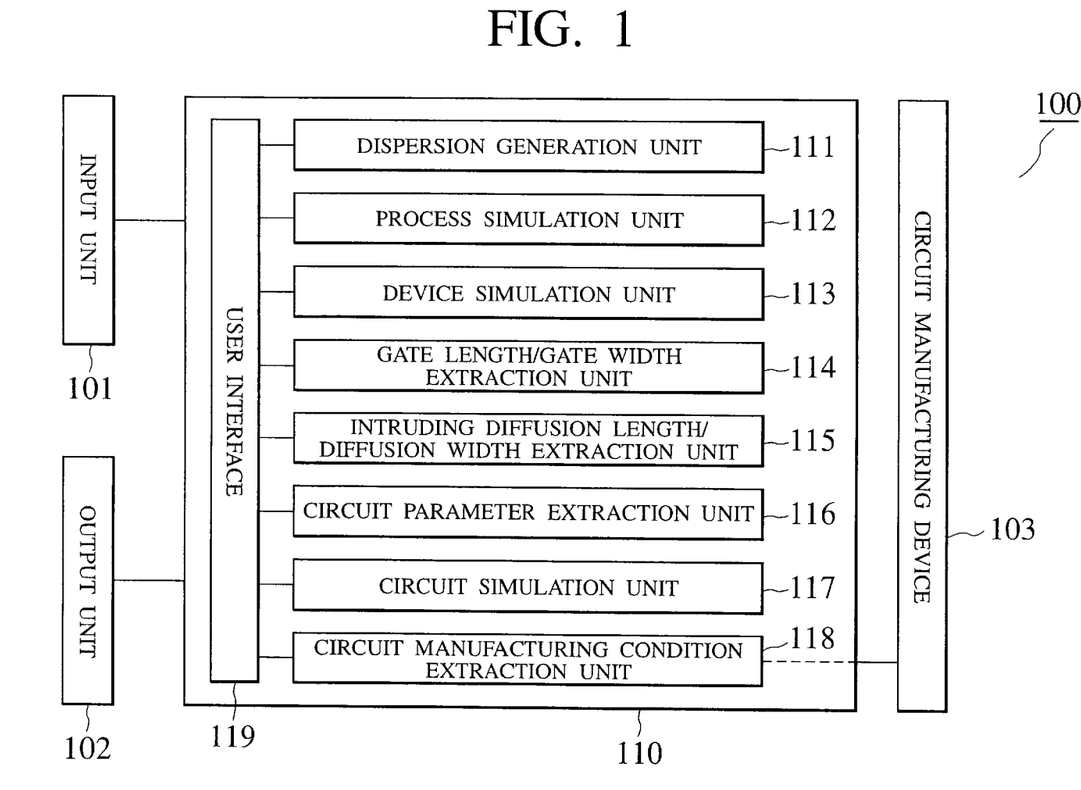
FIG. 1 is a block diagram showing the configuration of a circuit manufacturing system according to a first embodiment of the present invention.

FIG. 1 is a block diagram showing the configuration of a circuit manufacturing system according to the first embodiment of the present invention.

A circuit manufacturing system 100 according to the first embodiment of the present invention is constituted by, as shown in FIG. 1, a circuit manufacturing condition extraction device 110 for predicting the dispersion of circuit characteristics caused by variation in a manufacturing process of a semiconductor element and for determining manufacturing conditions of a circuit with reference to the result of the prediction, and a circuit manufacturing device 103 for manufacturing a circuit on the basis of the circuit manufacturing conditions determined by the circuit manufacturing condition extraction device 110.

The circuit manufacturing condition extraction device 110 comprises a dispersion generation unit 111 for generating N random numbers for process conditions and a gate length L0 and a gate width W0 of a mask to form N files for process simulation, a process simulation unit 112 for extracting pieces of information related to the element structures and the impurity concentration distribution of N semiconductor elements by using the files formed by the dispersion generation unit 111, a device simulation unit 113 for executing device simulation by using the pieces of information related to the element structures and the impurity concentration distributions extracted by the process simulation unit 112 to extract the electric characteristics of the semiconductor elements, a gate length/gate width extraction unit 114 for gate lengths and gate widths by using the information related to the element structures of the semiconductor elements and the extracted electric characteristics, a intruding diffusion length/diffusion width extraction unit 115 for extracting intruding diffusion lengths and intruding diffusion widths and circuit parameters corresponding to the intruding diffusion lengths and the intruding diffusion widths by using the information related to the element structures of the semiconductor elements and the extracted electric characteristics, a circuit parameter extraction unit 116 for extracting circuit parameters by using an analytic model, a circuit simulation unit 117 for describing the extracted circuit parameters in an input file for circuit simulation and then executing the circuit simulation to extract circuit characteristics, a circuit manufacturing condition extraction unit 118 for determining manufacturing conditions optimum for a circuit having desired circuit characteristics on the basis of the extracted circuit characteristics, and a user interface 119 for supporting operation control in the circuit manufacturing condition extraction device 110. In this case, as the user interface 119, a graphical user interface for supporting a processing operation by performing screen display is desirably used.

In addition, the circuit manufacturing condition extraction device 110 is connected to an input unit 101 for inputting input information and control parameters related to the circuit manufacturing condition extraction device 110 and an output unit 102 for outputting output information, error information, and the like related to the circuit manufacturing condition extraction device 110. In this case, a keyboard, a mouse pointer, a light pen, or the like is preferably used as the input unit 101, and a printer, a display device, or the like is preferably used as the output unit 102.

The operation of a circuit manufacturing system according to the embodiment will be described below with reference to FIG. 2.

Figure 2:
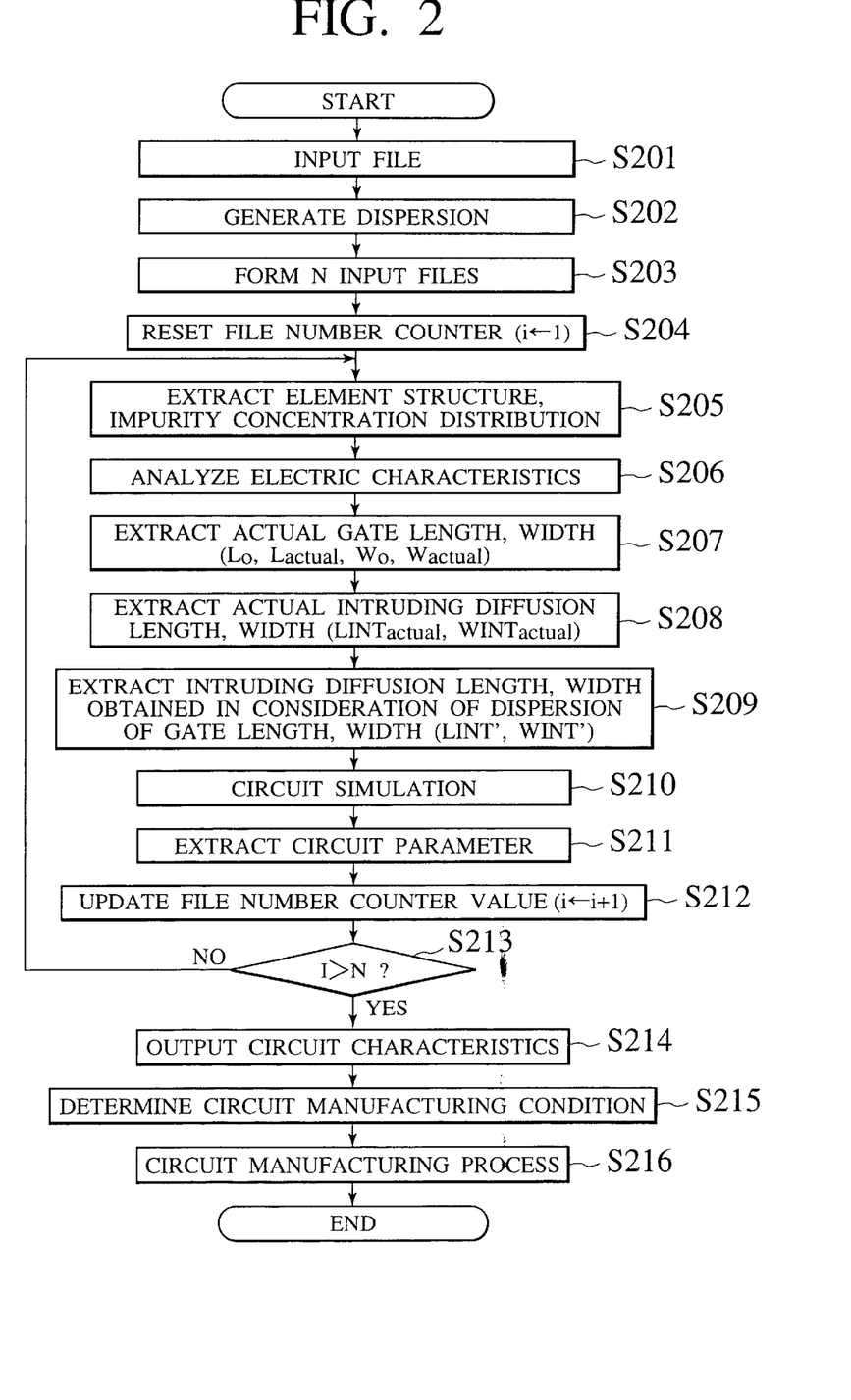
FIG. 2 is a flow chart showing a circuit manufacturing method according to the first embodiment of the present invention.

FIG. 2 is a flow chart showing a circuit manufacturing method according to the first embodiment of the present invention.

A circuit manufacturing process using the circuit manufacturing method according to the first embodiment of the present invention is executed by the following steps.

(1) Process conditions in the step of manufacturing MOSFETs and a file for process simulation in which a gate length L0 and a gate width W0 of a mask (design value) are described are input (file input step, S201).

(2) The dispersion generation unit 111 generates N random numbers by using a probability concentration function of the normal distribution with respect to the process conditions and the gate length L0 and the gate width W0 of the mask in the input file (dispersion generation step, S202).

(3) The dispersion generation unit 111 converts each of the process conditions and the gate length L0 and the gate width W0 of the mask with one value in the N random numbers and repeats this process N times to form N input files 1 to N for process simulation (input file forming step, S203).

(4) The value of a counter i ($1 \leq i \leq N$) for counting the input files is reset to be 1 (counter reset step, S204).

(5) The process simulation unit 112 executes process simulation by using an input file ($1 \leq i \leq N$) to extract pieces of information of the element structures and the impurity concentration distributions of the MOSFETs (element structure, impurity concentration distribution extraction step, S205).

(6) The device simulation unit 113 inputs the pieces of extracted information related to the element structures and the impurity concentration distributions of the MOSFETs to execute device simulation, and extracts two types of electric characteristics of the current-voltage characteristics and the capacitance-voltage characteristics of the MOSFETs (electric characteristic analyzing step, S206).

(7) The gate length/gate width extraction unit 114 extracts an actual (=in consideration of variation in process) gate lengths Lactual and actual gate widths Wactual by using the information related to the element structures of the MOSFETs and the extracted electric characteristics (gate length, gate width extracting step, S207).

(8) The intruding diffusion length/diffusion width extraction unit 115 extracts an actual intruding (=horizontal direction) diffusion length LINTactual and an actual intruding diffusion width WINTactual (see FIG. 4A and 4B for defining the intruding diffusion length) by using the information related to the element structures of the MOSFETs and the extracted electric characteristics (intruding diffusion length/diffusion width extracting step, S208).

(9) The intruding diffusion length/diffusion width extraction unit 115 substitutes the gate length L0 and the gate width W0 of the mask, the actual gate lengths Lactual and the gate widths Wactual, and the actual intruding diffusion lengths LINTactual and the actual intruding diffusion widths WINTactual for (equation 1) to (equation 4) to derive circuit parameters LINT' and WINT' (LINT', WINT' deriving step, S209).

$$\delta L = (Lactual - L0)/2 \quad \text{(equation 4)}$$

$$\delta W = (Wactual - W0)/2 \quad \text{(equation 5)}$$

$$LINT' = LINTactual - \delta l \quad \text{(equation 6)}$$

$$WINT' = WINTACTUAL - \delta W \quad \text{(equation 7)}$$

(10) The circuit parameter extraction unit 116 converts the circuit parameters LINT and WINT in the analytic model of the MOSFET into LINT' and WINT', and then extracts other parameters by using an analytic model obtained by converting the circuit parameters (circuit parameter extracting step, S210).

(11) The circuit simulation unit 117 describes the extracted circuit parameters in the input files for circuit simulation and executes the circuit simulation by using the input files to extract circuit characteristics (circuit simulation step, S211). In this case, when the circuit simulation is to be executed, the gate lengths L and the gate widths are fixed to L0 and W0 which are the gate length and the gate width of the mask.

(12) The value of the counter i is updated by 1 (counter updating step, S212).

(13) It is decided whether the value of the counter is N or more or not (decision step, S213). As a result of the decision, if the value is more than N, the flow shifts to (circuit characteristic outputting step, S214). If the value is N or less, the flow shifts to (element structure, impurity concentration distribution extracting step, S205).

(14) The N obtained circuit characteristics are output (circuit characteristic outputting step, S214).

(15) The circuit manufacturing condition extraction unit 118 determines manufacturing conditions optimum for manufacturing a circuit having desired circuit characteristics (circuit manufacturing conditions determining step, S215).

(16) The circuit manufacturing device 103 manufactures a circuit on the basis of the determined circuit manufacturing conditions (circuit manufacturing process step, S216).

In this embodiment, although the pieces of information related to the dispersions of the element structures and the electric characteristics of the MOSFETs are extracted by process/device simulation, the pieces of information related to the dispersions may be extracted by actually measuring the element structures and the electric characteristics of the real devices influenced by the variation in process without using the simulation.

In the embodiment, the circuit simulation unit 117 sequentially describes the circuit parameters extracted by the circuit parameter extraction unit 116 in the input files for circuit simulation to extract circuit characteristics. In place of this, by using a main component obtained by principal component analysis for the N circuit parameter sets, response surface models representing the circuit parameters may be described in the input files for circuit simulation to execute extraction of the circuit characteristics.

In this manner, in the circuit manufacturing system and the method therefor according to the first embodiment of the present invention, the magnitudes (Lerr=Lactual−L0) and (Werr=Wactual−W0) of the dispersions of the gate lengths and the gate widths are correctly reflected on specific circuit parameters LINT and WINT to extract other circuit parameters as LINT' and WINT', so that the circuit parameters except for LINT and WINT can be prevented from being adversely affected by the influence of the dispersions of the gate lengths and the gate widths. For this reason, the circuit parameters can be correctly extracted, and the circuit characteristics can be predicted at a high accuracy. As a result, manufacturing conditions for a circuit having desired circuit characteristics are correctly determined, and a semiconductor manufacturing process having a high yield can be performed.

In the circuit manufacturing system and the method therefor according to the first embodiment of the present invention, the magnitudes of the dispersions of gate lengths and gate widths are included in the specific circuit parameters LINT and WINT, so that the influence of the dispersions of the gate lengths and the gate widths can be reflected on the simulation result without giving a distribution to a description portion of the gate lengths and the gate widths in execution of circuit simulation. For this reason, in consideration of the influence of variation in process, the circuit characteristics can be evaluated at a high accuracy.

Second Embodiment

Figure 3:
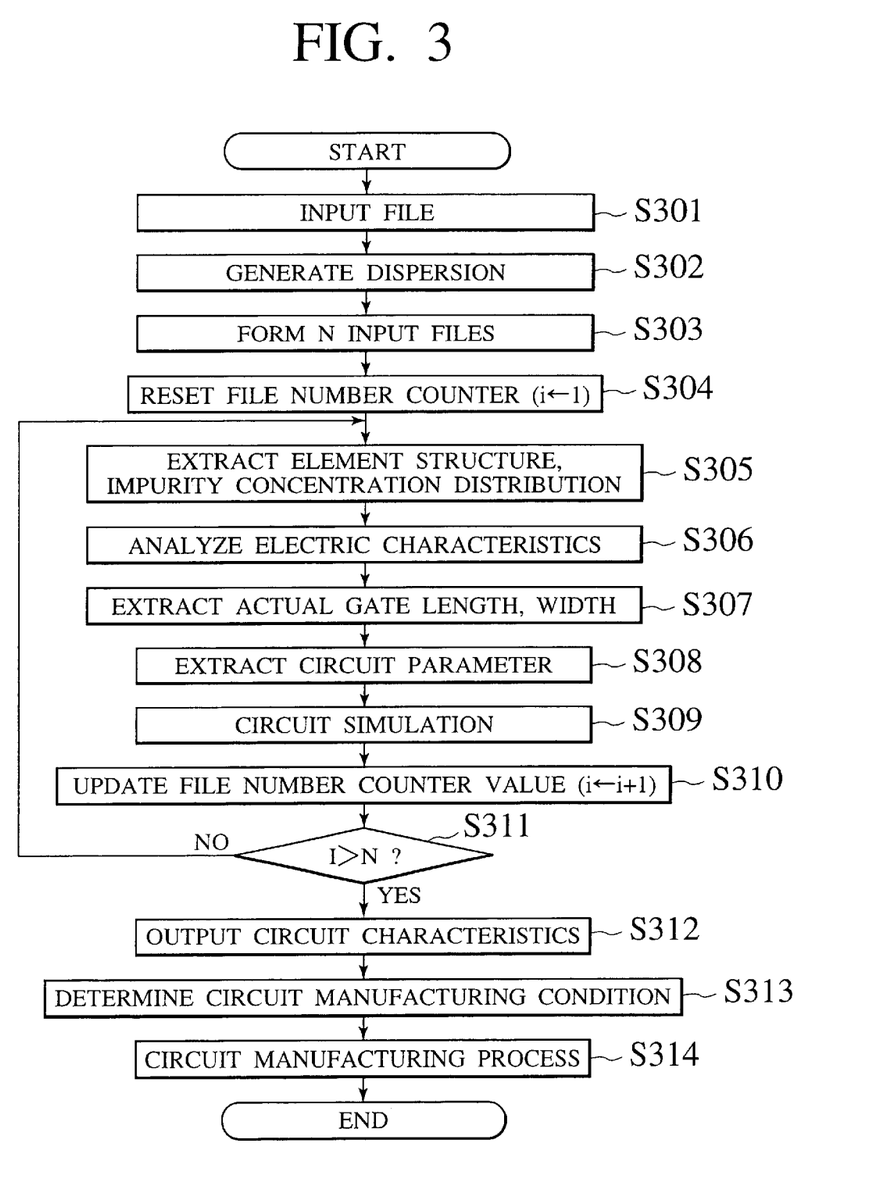
FIG. 3 is a flow chart showing a circuit manufacturing method according to a second embodiment of the present invention.
Figure 4A:
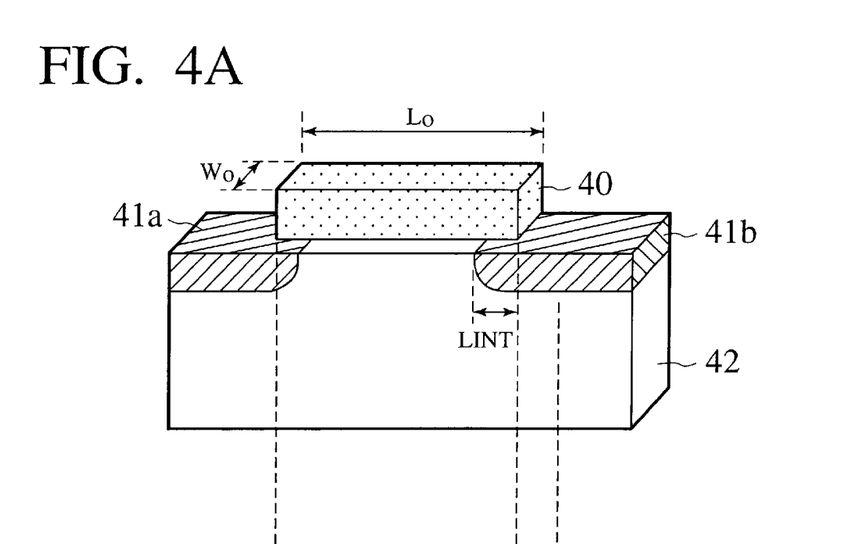
FIGS. 4A and 4B are typical diagrams for explaining a circuit parameter extracting process according to an embodiment of the present invention.
Figure 4B:
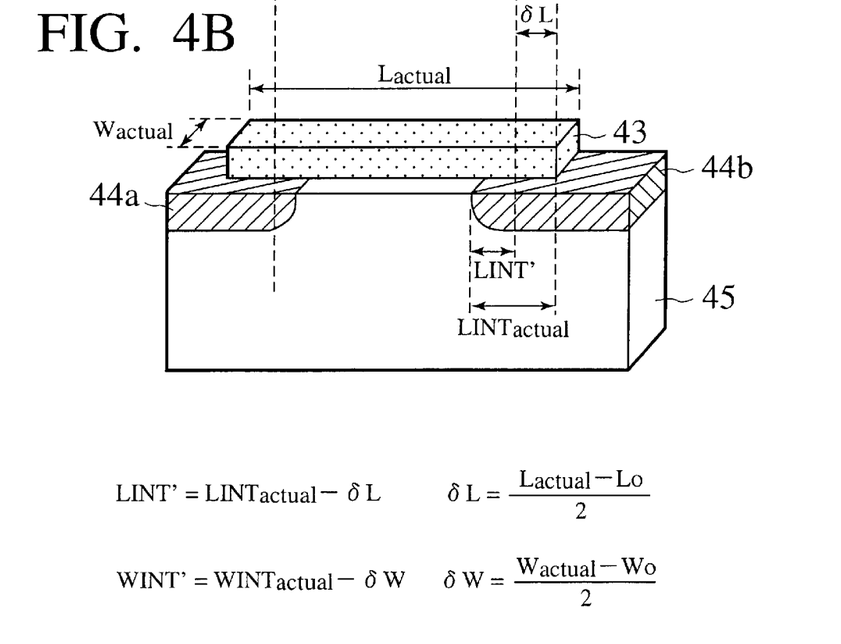

A circuit manufacturing system and an operation (circuit manufacturing method) according to the second embodiment of the present invention will be described below. Since the configuration of a circuit manufacturing system according to the second embodiment of the present invention is the same as that of the first embodiment, a description thereof will be omitted. The circuit manufacturing method according to the second embodiment of the present invention will be described below.

FIG. 3 is a flow chart showing the circuit manufacturing method according to the second embodiment of the present invention.

A circuit manufacturing process using the circuit manufacturing method according to the second embodiment of the present invention will be executed by the following steps.

(1) Process conditions in the step of manufacturing MOSFETs and a file for process simulation in which a gate length L0 and a gate width W0 of a mask (design value) are described are input (file input step, S301).

(2) The dispersion generation unit 111 generates N random numbers by using a probability concentration function of the normal distribution with respect to the process conditions and the gate length L0 and the gate width W0 of the mask in the input file (dispersion generation step, S202).

(3) The dispersion generation unit 111 converts each of the process conditions and the gate length L0 and the gate width W0 of the mask with one value in the N random numbers and repeats this process N times to form N input files 1 to N for process simulation (input file forming step, S303).

(4) The value of a counter i ($1 \leq i \leq N$) for counting the input files is reset to be 1 (counter reset step, S304).

(5) The process simulation unit 112 executes process simulation by using an input file (1≦i≦N) to extract pieces of information of the element structures and the impurity concentration distributions of the MOSFETs (element structure, impurity concentration distribution extraction step, S305).

(6) The device simulation unit 113 inputs the pieces of extracted information related to the element structures and the impurity concentration distributions of the MOSFETs to execute device simulation, and extracts two types of electric characteristics of the current-voltage characteristics and the capacitance-voltage characteristics of the MOSFETs (electric characteristic analyzing step, S306).

(7) The gate length/gate width extraction unit 114 extracts actual gate lengths Lactual and actual gate widths Wactual by using the information related to the element structures of the MOSFETs and the extracted electric characteristics (gate length, gate width extracting step, S307).

(8) The circuit parameter extraction unit 116 substitutes the actual gate lengths Lactual and the actual gate widths Wactual for variables corresponding to gate lengths and gate widths in the analytic models of the MOSFETs and extracts the other circuit parameters by using the substituted analytic models (circuit parameter extracting step, S308).

(9) The circuit simulation unit 117 substitutes a description portion of the gate lengths and the gate widths in an input file for circuit characteristic analysis for the actual gate lengths Lactual and the actual gate widths Wactual and describes the extracted circuit parameters in the input file for circuit simulation. The circuit simulation unit 117 executes the circuit simulation by using the input file to extract circuit characteristics (circuit simulation step, S309). The description portion of the gate lengths and the gate widths in the input file for circuit characteristic analysis may be substituted for random numbers generated by the distribution function that represents actual gate lengths and actual gate widths distribution, instead that the description portion is substituted for the actual gate lengths Lactual and the actual gate widths Wactual.

(10) The value of the counter i is updated by 1 (counter updating step, S310).

(11) It is decided whether the value of the counter is N or more or not (decision step, S313) . As a result of the decision, if the value is more than N, the flow shifts to (circuit characteristic outputting step, S312). If the value is N or less, the flow shifts to (element structure, impurity concentration distribution extracting step, S305).

(12) The N obtained circuit characteristics are output (circuit characteristic outputting step, S312).

(13) The circuit manufacturing condition extraction unit 118 determines manufacturing conditions optimum for manufacturing a circuit having desired circuit characteristics (circuit manufacturing conditions determining step, S313).

(14) The circuit manufacturing device 103 manufactures a circuit on the basis of the determined circuit manufacturing conditions (circuit manufacturing process step, S314).

Figure 6:
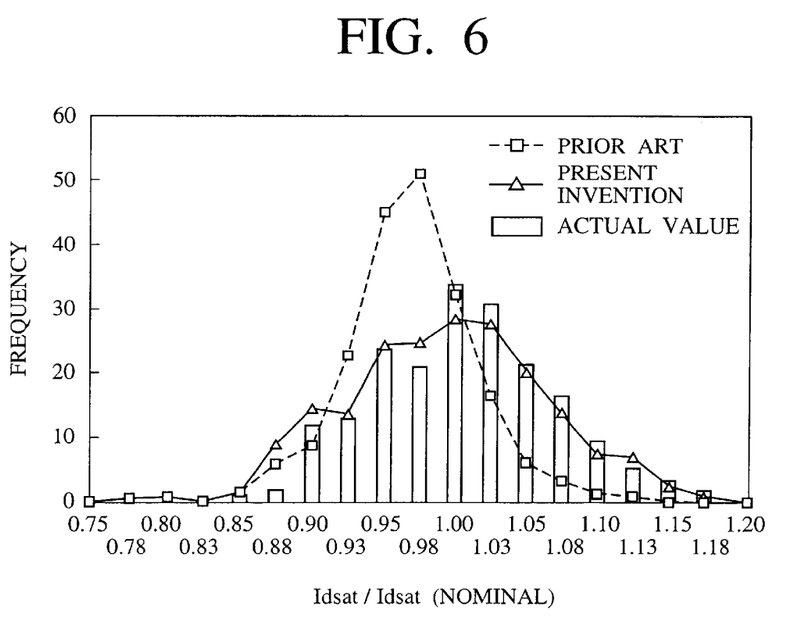
FIG. 6 is a graph showing analytic results of the dispersion of electric characteristics using the present invention and a prior art.

In this manner, in the circuit manufacturing system and the method therefor according to the second embodiment of the present invention, since the actual gate lengths and the actual gate widths are used when circuit parameters are extracted, the circuit parameters can be extracted at a high accuracy. In addition, as gate lengths and gate widths used in each of circuit simulation, the actual gate lengths and the actual gate widths which are obtained are given, or distributions generated by random numbers are given, so that dispersions can be given to the gate lengths and the gate widths. For this reason, as shown in FIG. 6, unlike a conventional method for fixing gate lengths, the dispersion of circuit characteristics can be correctly evaluated, and the magnitude of the dispersion can be correctly predicted.

Figure 5:
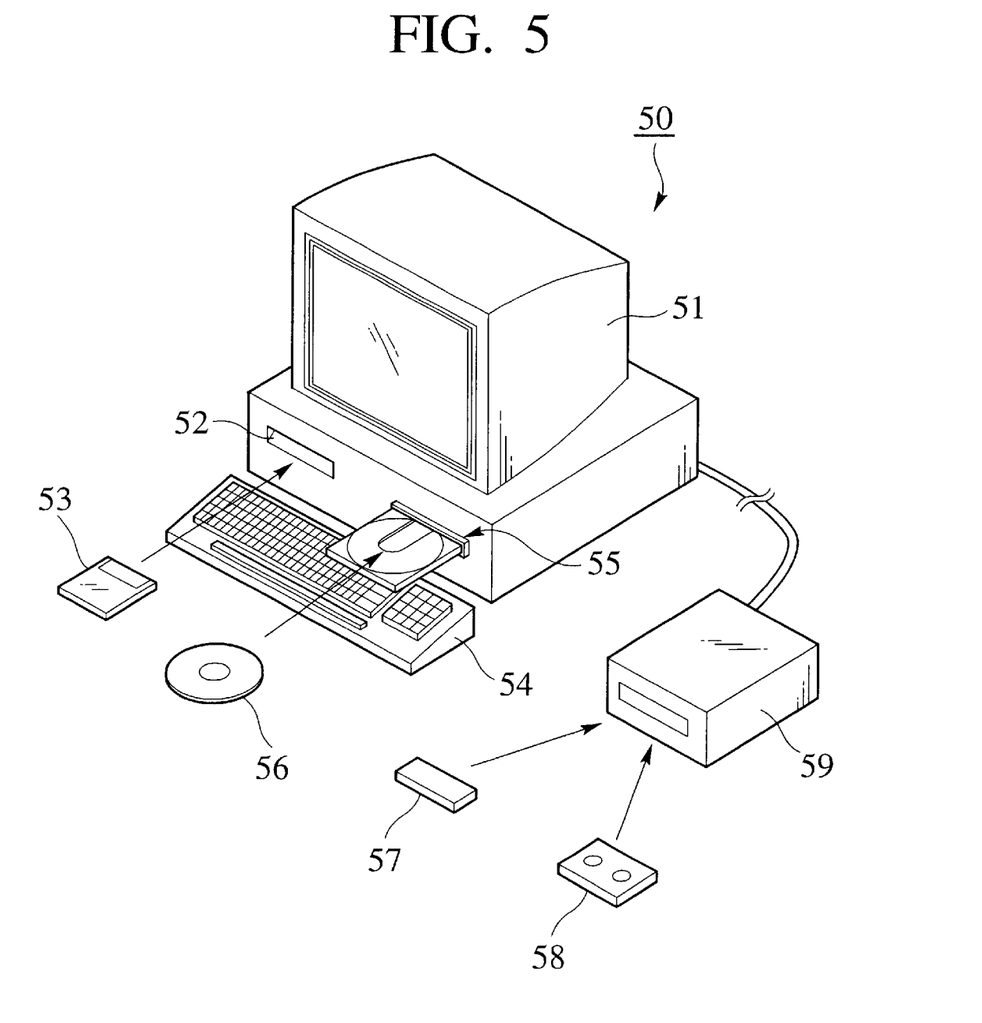
FIG. 5 is a diagram showing the appearance of a manufacturing condition extraction unit according to an embodiment of the present invention.

A circuit manufacturing condition extraction device according to the embodiment of the present invention has, for example, the appearance shown in FIG. 5. More specifically, a circuit design device according to the embodiment of the present invention is constituted such that elements of a manufacturing parameter extraction device are incorporated in a computer system 50. The computer system 50 comprises a floppy disk drive 52 and an optical disk drive 55. A floppy disk 53 and an optical disk 56 are inserted into the floppy disk drive 52 and the optical disk drive 55, respectively, and predetermined reading operations are performed, so that circuit manufacturing programs stored in these recording media can be installed in the computer system 50. In addition, when an appropriate drive device 59 is connected to the computer system 50, for example, the circuit manufacturing programs can also be installed by using a ROM 57 serving as a memory device or a cartridge 58 serving as a magnetic tape device.

A manufacturing parameter extraction device according to the embodiment of the present invention may be programmed and stored in a computer readable recording medium. When the manufacturing parameter extraction program is to be executed, the recording medium is loaded by the computer system, the circuit manufacturing program is stored in a recording unit such as a memory in the computer system, and the process in the program is executed. In this manner, the circuit manufacturing system and the method therefor according to the embodiment of the present invention can be realized on the computer system. Here, the recording medium means a computer readable medium such as a semiconductor memory, a magnetic disk, an optical disk, a photomagnetic disk, a magnetic tape, or a digital video disk in which a program can be recorded or a communication medium such as a signal.

Other Embodiments

Various modifications will become possible for those skilled in the art after receiving the teachings of the present disclosure without depending from the scope thereof.

What is claimed is:

1. A circuit simulation device comprising:
   a dispersion generator configured to receive mask information including a gate length and width of a mask of a circuit, the dispersion generator configured to generate a plurality of mask data including process conditions and the gate lengths and widths based on the mask information;
   a process simulator configured to receive the plurality of mask data and to execute process simulation for the mask data using the process conditions and the gate lengths and widths, the process simulator configured to obtain circuit information about structures and impurity concentration distribution of the circuit in connection with the mask data;
   a device simulator configured to receive the information about the structures and impurity concentration distribution of the circuit and to obtain electric characteristics of the circuit in connection with the mask data;
   a gate length and width extraction unit configured to calculate actual gate lengths and widths based on the information about the structures and the electric characteristics of the circuit;

an intruding diffusion length and width extraction unit configured to calculate actual intruding diffusion length and width based on the information about the structures and the electric characteristics of the circuit, the intruding diffusion length and width extraction unit configured to obtain circuit parameters of the gate length and width using differences between the actual gate lengths and widths and the gate length and width of the mask of the circuit;

a circuit parameter extraction unit configured to obtain circuit parameters other than the gate length and width and to introduce the circuit parameters of the gate length and width into analytic models of a semiconductor; and a circuit simulation unit configured to execute circuit simulation by using the obtained circuit parameters to obtain circuit characteristics related to the semiconductor.

2. The circuit simulation device according to claim 1, wherein the circuit simulation is performed by using response curved surface models in which the circuit parameters are described by using principal components obtained by principal component analysis for the circuit parameters.

3. The circuit simulation device as claimed in claim 1, wherein the dispersion generator generates random numbers by using a probability concentration function of normal distribution with respect to the received mask information to generate the plurality of mask data.

4. A circuit simulation method comprising:

receiving mask information including a gate length and width of a mask of a circuit to generate a plurality of mask data including process conditions and the gate lengths and widths based on the mask information;

executing process simulation for the mask data using the process conditions and the gate lengths and widths, the process simulator configured to obtain circuit information about structures and impurity concentration distribution of the circuit in connection with the mask data;

executing device simulation to obtain electric characteristics of the circuit in connection with the mask data based on the information about the structures and impurity concentration distribution of the circuit;

calculating actual gate lengths and widths based on the information about the structures and the electric characteristics of the circuit;

calculating actual intruding diffusion length and width based on the information about the structures and the electric characteristics of the circuit to obtain circuit parameters of the gate length and width using differences between the actual gate lengths and widths and the gate length and width of the mask of the circuit;

obtaining circuit parameters other than the gate length and width and to introduce the circuit parameters of the gate length and width into analytic models of a semiconductor; and executing circuit simulation using the obtained circuit parameters to obtain circuit characteristics related to the semiconductor.

5. The circuit simulation method according to claim 4, wherein the circuit simulation is performed by using response surface models in which the circuit parameters are described by using principal components obtained by principal component analysis for the circuit parameters.

6. The circuit simulation method according to claim 4, wherein the circuit is a MOSFET.

7. A circuit simulation program product comprising:

a computer readable program code for receiving mask information including a gate length and width of a mask of a circuit to generate a plurality of mask data including process conditions and the gate lengths and widths based on the mask information;

a computer readable program code for executing process simulation for the mask data using the process conditions and the gate lengths and widths, the process simulator configured to obtain circuit information about structures and impurity concentration distribution of the circuit in connection with the mask data;

a computer readable program code for executing device simulation to obtain electric characteristics of the circuit in connection with the mask data based on the information about the structures and impurity concentration distribution of the circuit;

a computer readable program code for calculating actual gate lengths and widths based on the information about the structures and the electric characteristics of the circuit;

a computer readable program code for calculating actual intruding diffusion length and width based on the information about the structures and the electric characteristics of the circuit to obtain circuit parameters of the gate length and width using differences between the actual gate lengths and widths and the gate length and width of the mask of the circuit;

a computer readable program code for obtaining circuit parameters other than the gate length and width to introduce the circuit parameters of the gate length and width into analytic models of a semiconductor; and a computer readable program code for extracting executing circuit simulation by using the obtained circuit parameters to obtain circuit characteristics related to the semiconductor.

8. A circuit manufacturing method comprising:

receiving mask information including a gate length and width of a mask of a circuit to generate a plurality of mask data including process conditions and the gate lengths and widths based on the mask information;

executing process simulation for the mask data using the process conditions and the gate lengths and widths, the process simulator configured to obtain circuit information about structures and impurity concentration distribution of the circuit in connection with the mask data;

executing device simulation to obtain electric characteristics of the circuit in connection with the mask data based on the information about the structures and impurity concentration distribution of the circuit;

calculating actual gate lengths and widths based on the information about the structures and the electric characteristics of the circuit;

calculating actual intruding diffusion length and width based on the information about the structures and the electric characteristics of the circuit to obtain circuit parameters of the gate length and width using differences between the actual gate lengths and widths and the gate length and width of the mask of the circuit;

obtaining circuit parameters other than the gate length and width to introduce the circuit parameters of the gate length and width into analytic models of a semiconductor, and executing circuit simulation using the obtained circuit parameters to obtain circuit characteristics related to the semiconductor; and predicting the dispersion of the circuit characteristics on the basis of the obtained circuit characteristics to determine manufacturing conditions optimum for manufacturing a circuit having desired circuit characteristics.

* * * * *